US012628313B2

(12) United States Patent　　　　(10) Patent No.:　US 12,628,313 B2

Tu et al.　　　　(45) Date of Patent:　May 12, 2026

(54) IMMERSION COOLING SYSTEM WITH BAFFLE ASSEMBLY WITH SIDE PLATES AND GUIDING PLATES

(71) Applicant: Wiwynn Corporation, New Taipei City (TW)

(72) Inventors: Tai-Ying Tu, New Taipei City (TW); Zi-Ping Wu, New Taipei City (TW); Chun-Wei Lin, New Taipei City (TW); Ting-Yu Pai, New Taipei City (TW)

(73) Assignee: WIWYNN CORPORATION, New Taipei City (TW)

( * ) Notice: Subject to any disclaimer, the term of this patent is extended or adjusted under 35 U.S.C. 154(b) by 293 days.

(21) Appl. No.: 18/344,088

(22) Filed: Jun. 29, 2023

(65) Prior Publication Data

US 2024/0015929 A1　　Jan. 11, 2024

(30) Foreign Application Priority Data

Jul. 8, 2022　(TW) .................................. 111125828

(51) Int. Cl.
H05K 7/20　　　(2006.01)
(52) U.S. Cl.
CPC ......... H05K 7/203 (2013.01); H05K 7/20318 (2013.01); H05K 7/20663 (2013.01);
(Continued)
(58) Field of Classification Search
CPC ........... H05K 7/20236; H05K 7/20254; H05K 7/203; H05K 7/20318; H05K 7/2039;
(Continued)

(56) References Cited

U.S. PATENT DOCUMENTS 5,063,476 A　*　11/1991　Hamadah .............. H01L 23/467
　　　　　　　　　　　　　257/E23.099
7,495,914 B2 *　2/2009　Tilton ................. H01L 23/4735
　　　　　　　　　　　　　361/689
(Continued)

FOREIGN PATENT DOCUMENTS

CN　　　109843025 A　　6/2019
CN　　　111629566 A　　9/2020
(Continued)

OTHER PUBLICATIONS

Examination report dated Dec. 13, 2022, listed in related Taiwan patent application No. 111125827.

(Continued)

*Primary Examiner* — Jayprakash N Gandhi
*Assistant Examiner* — Steven Ngo
(74) *Attorney, Agent, or Firm* — McClure, Qualey & Rodack, LLP

(57)　　　　ABSTRACT

An immersion cooling system including a cooling tank, an immersion unit, and a baffle assembly is provided. The cooling tank has a receiving portion. The immersion unit is in the receiving portion and includes a boiler plate. The baffle assembly divides the receiving portion into an inner upper portion, an inner lower portion, and a peripheral portion. The boiler plate is in the inner lower portion, and a width of the inner upper portion is less than or equal to a width of the boiler plate.

20 Claims, 12 Drawing Sheets

(52) U.S. Cl.
CPC ......... *H05K 7/208* (2013.01); *H05K 7/20809* (2013.01); *H05K 7/20236* (2013.01); *H05K 7/20627* (2013.01); *H05K 7/20763* (2013.01)

(58) Field of Classification Search
CPC .......... H05K 7/20627; H05K 7/20663; H05K 7/20763; H05K 7/208; H01L 23/42; H01L 23/427; H01L 23/44; H01L 23/46; H01L 23/473
See application file for complete search history.

(56) References Cited

U.S. PATENT DOCUMENTS

| | | | | |
|---|---|---|---|---|
| 10,512,192 | B2 * | 12/2019 | Miyoshi | H01L 21/67109 |
| 11,432,431 | B1 * | 8/2022 | Embleton | G06F 1/20 |
| 11,800,683 | B2 * | 10/2023 | Horng | H05K 7/203 |
| 2010/0290190 | A1 * | 11/2010 | Chester | H05K 7/20 174/547 |

| | | | | |
|---|---|---|---|---|
| 2017/0354066 | A1 * | 12/2017 | Kodama | H05K 7/20836 |
| 2021/0059079 | A1 * | 2/2021 | Keehn | H05K 7/20327 |
| 2021/0410319 | A1 * | 12/2021 | Manousakis | H05K 7/20809 |
| 2022/0346278 | A1 * | 10/2022 | Kodama | H05K 7/20318 |

FOREIGN PATENT DOCUMENTS

| | | |
|---|---|---|
| CN | 213694613 U | 7/2021 |
| CN | 216532287 U | 5/2022 |
| JP | 3964193 B2 | 8/2007 |

OTHER PUBLICATIONS

Examination report dated Sep. 28, 2023, listed in related Taiwan patent application No. 111125829.
Examination report dated Jul. 12, 2023, listed in related Taiwan patent application No. 111125829.

* cited by examiner

IMMERSION COOLING SYSTEM WITH BAFFLE ASSEMBLY WITH SIDE PLATES AND GUIDING PLATES

CROSS-REFERENCE TO RELATED APPLICATION

This non-provisional application claims priority under 35 U.S.C. § 119(a) to Patent Application No. 111125828 filed in Taiwan, R.O.C. on Jul. 8, 2022, and the entire contents of which are hereby incorporated by reference.

BACKGROUND

Technical Field

The instant disclosure relates to an immersion cooling system, particularly an immersion cooling system having a baffle assembly.

Related Art

An immersion cooling system usually refers to a system capable of transmitting the heat generated by an electronic device to a heat transfer fluid by submerging the electronic device in a heat transfer fluid; therefore, the temperature of the electronic device can be reduced. Hence, the working temperature of the electronic device can be maintained within a proper range to reach desired working performance and service life of the electronic device.

In the process of transferring the heats from the electronic device to the heat transfer fluid, the heat transfer fluid with a lower boiling point will be first boiled and vaporized, and thus bubbles in a large amount will be quickly generated at interfaces (as well as the proximity of the interfaces) between the electronic device and the heat transfer fluid. These bubbles will be widely dispersed in the heat transfer fluid.

SUMMARY

In view of this, according to some embodiments, an immersion cooling system is provided and comprises a cooling tank, an immersion unit, and a baffle assembly. The cooling tank has a receiving portion. The immersion unit is in the receiving portion and comprises a boiler plate. The baffle assembly divides the receiving portion into an inner upper portion, an inner lower portion, and a peripheral portion. The boiler plate is in the inner lower portion, and a width of the inner upper portion is less than or equal to a width of the boiler plate.

According to some embodiments, the immersion cooling system further comprises a heat transfer fluid. The heat transfer fluid is received in the receiving portion and at least submerges the boiler plate. The immersion unit further comprises a main body frame and an electronic device. The electronic device is in the main body frame and comprises a heating element contacting the boiler plate.

According to some embodiments, the immersion cooling system further comprises a condensation device above a surface of the heat transfer fluid.

According to some embodiments, the baffle assembly comprises two side plates and two guiding plates. The two side plates are respectively at opposite sides of the boiler plate, wherein a section between the two side plates is the inner lower portion. One of two ends of each of the two guiding plates is connected to a corresponding one of the two side plates, and a section between the two guiding plates is the inner upper portion.

According to some embodiments, the baffle assembly comprises a plurality of sub-guiding plates. The sub-guiding plates correspond to the two guiding plates to obtain a plurality of the inner upper portions from the receiving portion. Sections between the two guiding plates and the sub-guiding plates are the inner upper portions.

According to some embodiments, the immersion cooling system further comprises a plurality of the immersion units. Two sides of the baffle assembly are opposite to each other, and the baffle assembly divides the receiving portion into two sub receiving portions at the two sides of the baffle assembly. Each of the two sub receiving portions has the inner upper portion, the inner lower portion, and the peripheral portion, wherein the inner upper portion, the inner lower portion, and the peripheral portion at each of the two sides are in communication with each other. The boiler plates at each of the two sides are in the inner lower portions. The width of the inner upper portion at each of the two sides is less than or equal to the width of the boiler plate at each of the two sides. The immersion units correspond to the two sides of the baffle assembly, and the boiler plate of each of the immersion units is in the inner lower portion which is at a corresponding one of the two sides.

According to some embodiments, the immersion cooling system further comprises a plurality of the immersion units and a plurality of the baffle assemblies. Each of the immersion units corresponds to a corresponding one of the baffle assemblies, and the boiler plate of each of the immersion units is in a portion of the inner lower portion of the receiving portion corresponding to a corresponding one of the corresponding baffle assemblies.

According to some embodiments, the immersion cooling system further comprises a plurality of the immersion units and a plurality of the baffle assemblies, wherein each of the immersion units corresponds to a corresponding one of the baffle assemblies.

To sum up, in some embodiments, an immersion cooling system having a baffle assembly is provided. The baffle assembly divides a receiving portion of the immersion cooling system into a guiding channel and the guiding channel comprises an inner upper portion and an inner lower portion. In some embodiments, when a boiler plate in operation is in the inner lower portion and submerged by a heat transfer fluid, a large number of bubbles would be generated in the heat transfer fluid and flow toward the inner upper portion. Hence, the bubbles can be prevented from staying in place or flowing to other locations of the heat transfer fluid. In addition, according to some embodiments, through improving conditions of the bubbles (such as staying in place or flowing to other locations in the heat transfer fluid), pollutants generated at the surface of the boiler plate (or the proximity of the boiler plate) can be also removed at the same time, so that the pollutants that would further affect the cooling performance of the boiler plate can be prevented from being accumulated at the surface of the boiler plate (or the proximity of the boiler plate).

DETAILED DESCRIPTION

Figure 1A:
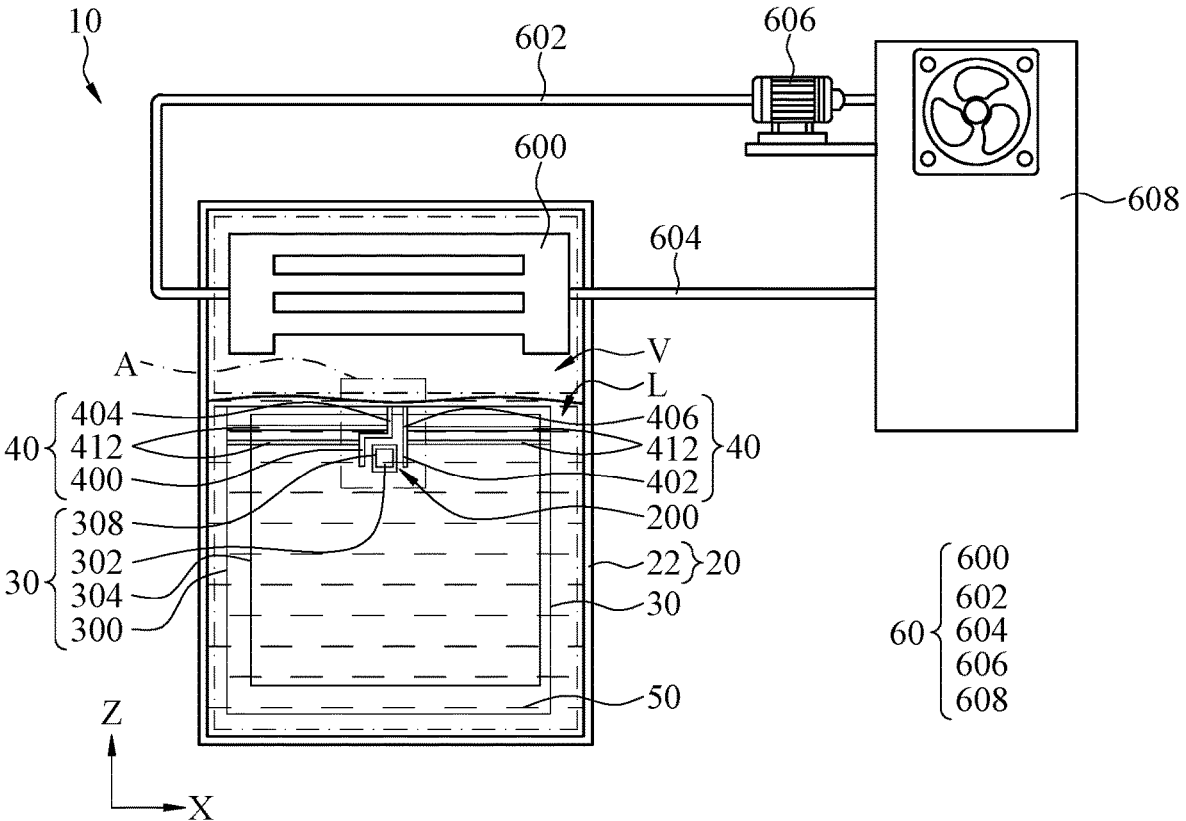
FIG. 1A illustrates a schematic structural view of an immersion cooling system according to some embodiments.
Figure 2:
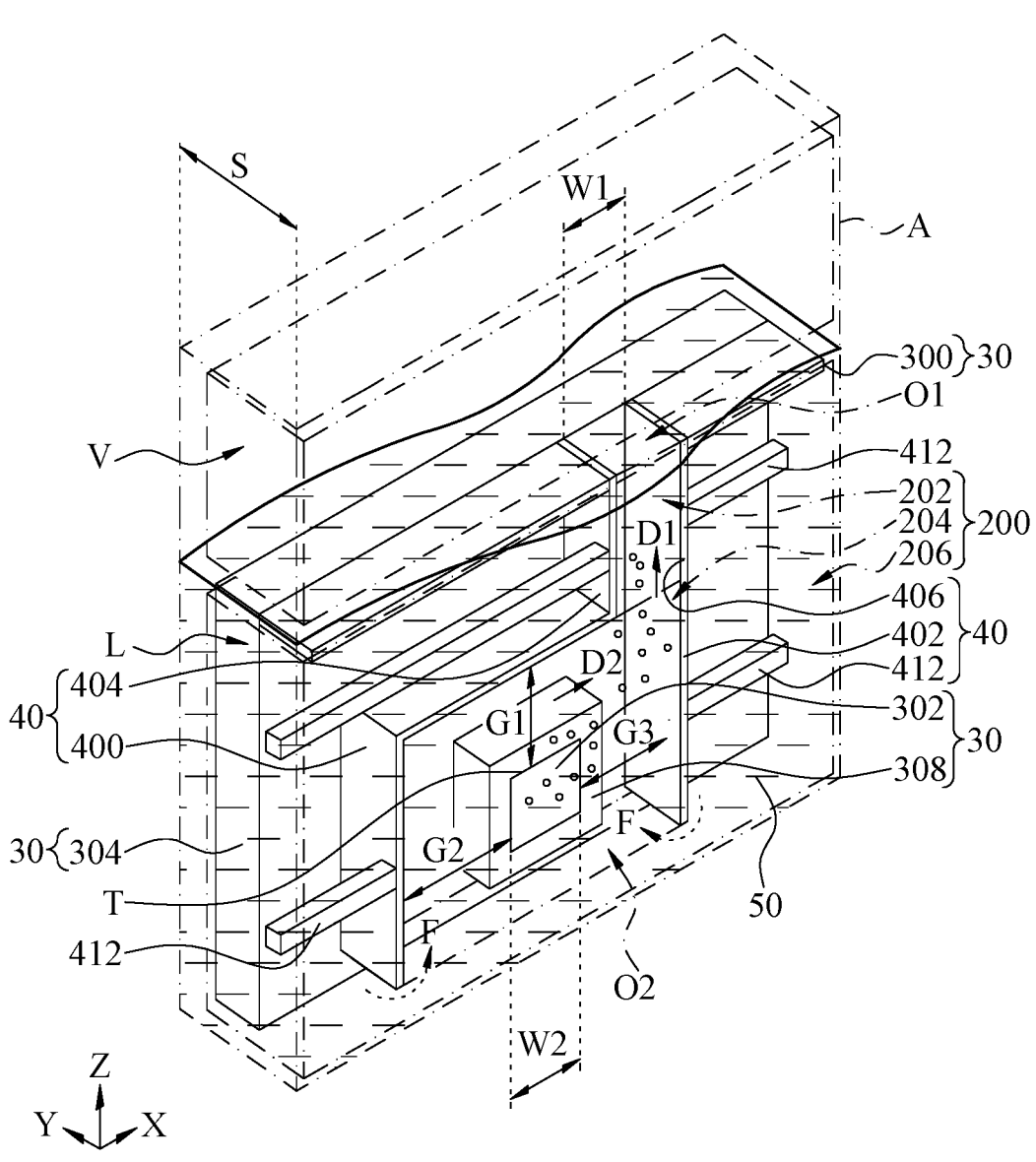
FIG. 2 illustrates a schematic perspective and working view according to a partial section A shown in FIG. 1A.

Please refer to FIG. 1A and FIG. 2 at the same time. FIG. 1A illustrates a schematic structural view of an immersion cooling system 10 according to some embodiments, and FIG. 2 illustrates a schematic perspective and working view according to a partial section A shown in FIG. 1A (to more clearly illustrate each of the embodiments, in the instant disclosure, the elements and the numerals of the elements (e.g., a receiving portion 200 and a baffle support 412) which are already illustrated in FIG. 1A are omitted and not shown in black line in FIG. 2). An immersion cooling system 10 comprises a cooling tank 20, an immersion unit 30, and a baffle assembly 40. The cooling tank 20 has a receiving portion 200 (as shown in FIG. 2). The immersion unit 30 is in the receiving portion 200 and comprises a boiler plate 302. In the partial section A of FIG. 2, the baffle assembly 40 divides the receiving portion 200 into an inner upper portion 202, an inner lower portion 204, and a peripheral portion 206, wherein the inner upper portion 202, the inner lower portion 204, and the peripheral portion 206 are in communication with each other. The boiler plate 302 is in the inner lower portion 204. A width W1 of the inner upper portion 202 is less than or equal to a width W2 of the boiler plate 302. In some embodiments, the width W1 of the inner upper portion 202 may be, but not limited to, any value ranging between 5 mm and 20 mm. In some embodiments, material of the boiler plate 302 may be, but not limited to, metal, alloy, or metal composite; preferably, in one embodiment, copper or copper alloy. Hence, through the width W1 of the inner upper portion 202 that is less than the width W2 of the boiler plate 302, the inner upper portion 202 can serve as a guiding channel with a function of guiding (which will be described later).

Figure 1B:
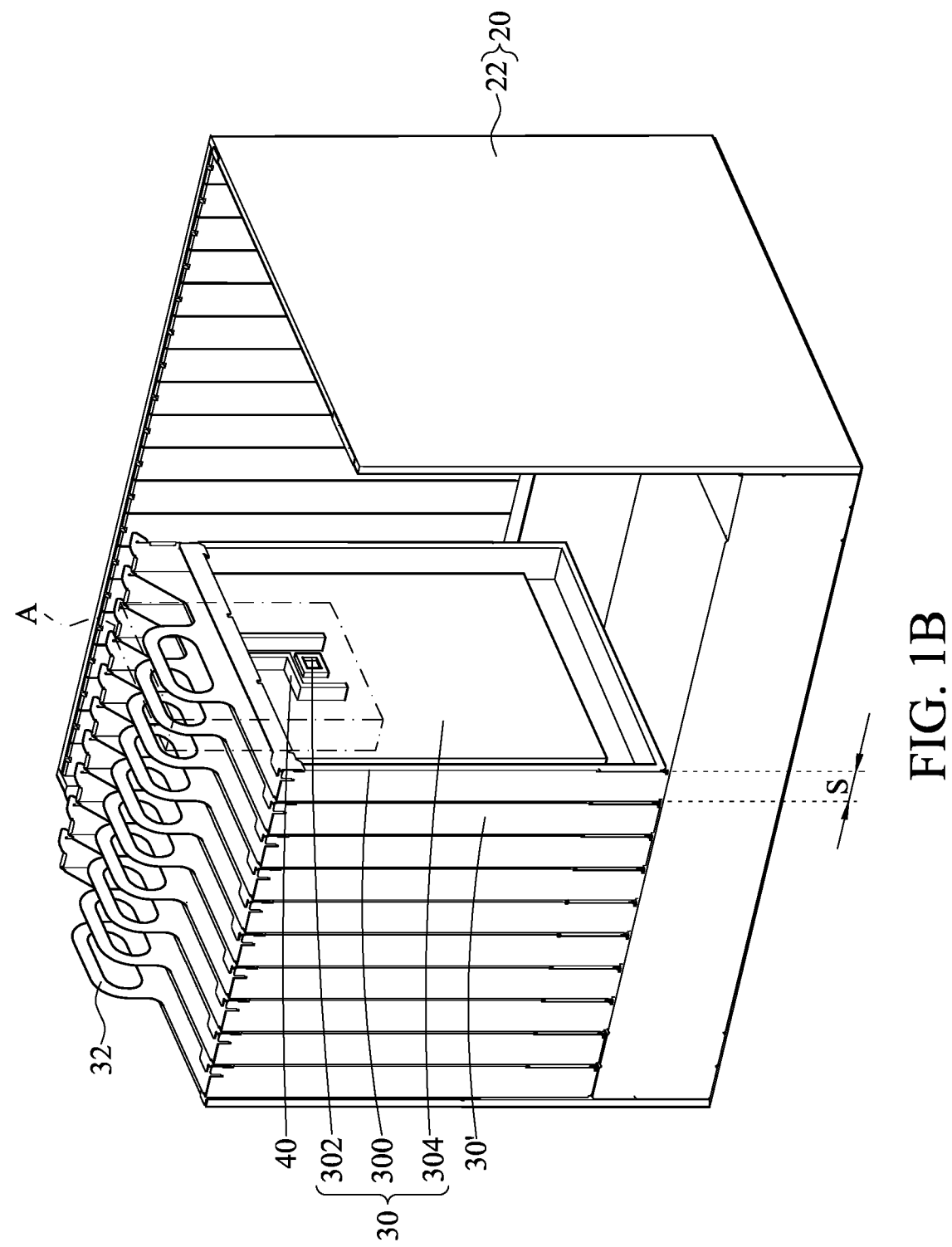
FIG. 1B illustrates a partial schematic perspective view of an immersion cooling system applied to a cabinet-mounted server system according to some embodiments.

Please refer to FIG. 1B. FIG. 1B illustrates a partial schematic perspective view of an immersion cooling system 10 applied to a cabinet-mounted server system according to some embodiments. Only a partial structure for receiving the lower part of a cabinet 22 of the immersion unit 30 shown in FIG. 1A is shown in FIG. 1B (it is noted that, for ease of understanding, a front plate at the lower part of the cabinet 22 is removed from the figure). The immersion cooling system 10 may be equipped with a single immersion unit 30 or a plurality of immersion units 30. The single immersion unit 30 may be, but not limited to, a rack-mounted server unit. The immersion cooling system 10 may be also equipped with a plurality of the immersion units 30 according to some embodiments, and the immersion cooling system 10 may be, but not limited to, a cabinet-mounted server system shown in FIG. 1B. The cabinet-mounted server system comprises a cabinet 22 which receives a plurality of immersion units 30, and each of the immersion units 30 is a rack-mounted server unit with a thickness S. The thickness S of each of the rack-mounted server units may be identical or different from each other; for example, the thickness S may be 48.26 cm (i.e., 19 inch). The thickness S (as shown in FIG. 1B) of each of the rack-mounted server units may be adjusted according to different specifications of the server; for example, the thickness S may be a multiple of 4.445 cm; that is, the thickness S may be, but not limited to, 1 U (i.e., 4.445 cm), 2 U (i.e., 2*4.445 cm; 8.89 cm), 3 U (i.e., 3*4.445 cm; 13.335 cm), or 4 U (i.e., 4*4.445 cm; 17.78 cm). Therefore, the immersion units 30 or the cooling tank 20 where the immersion units 30 are received can serve as a system-level device (such as a server) with various thickness S, or a system-assembly-level device (such as a server assembly).

Figure 3A:
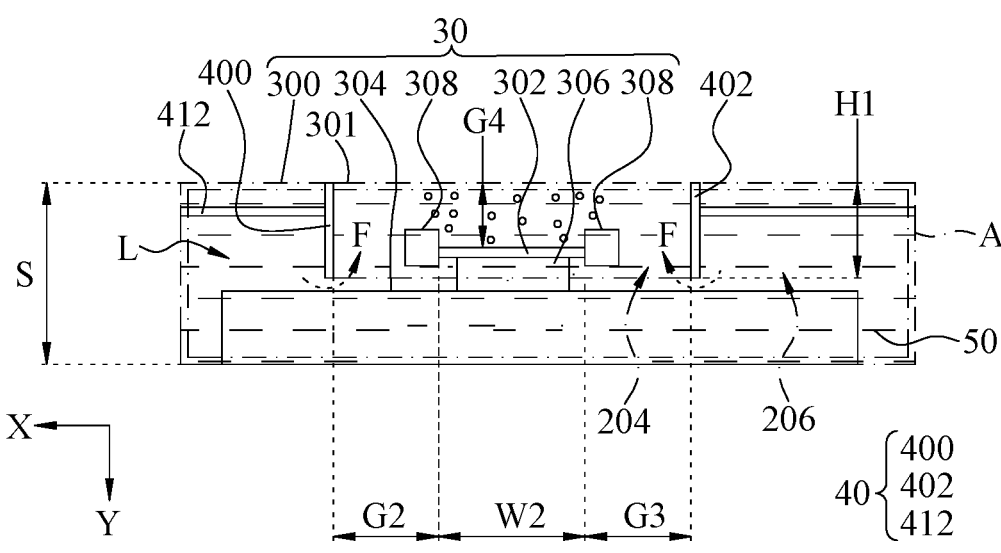
FIG. 3A illustrates a schematic working view in a first view (i.e., the XY plane) of a single immersion unit of the immersion cooling system shown in FIG. 2.
Figure 4:
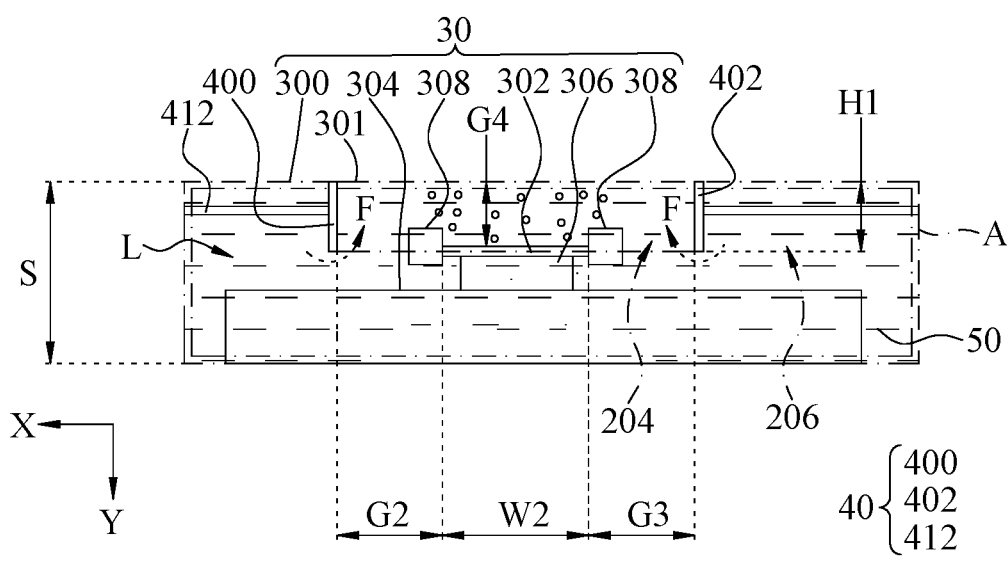
FIG. 4 illustrates a schematic working view in the first view (i.e., the XY plane) of a single immersion unit of the immersion cooling system shown in FIG. 2.

The immersion units 30 serving as rack-mounted server units according to some embodiments are described below as an exemplified illustration. Each of the immersion units 30 comprises a main body frame 300 and an electronic device 304. The main body frame 300 is for fixing the electronic device 304. The electronic device 304 may be, but not limited to, a device such as a printed circuit board (i.e., PCB), a mother board, a server, or the like. The dimension of the main body frame 300 may be, for example, complied with the dimensions of 1 U, 2 U, 3 U, or 4 U. The electronic device 304 comprises a heating element 306 (which is shown in FIG. 3A and FIG. 4 and will be described later), and the boiler plate 302 contacts the heating element 306. The heating element 306 may be, but not limited to, a chip, and the chip can be, but not limited to, a CPU or a display chip (i.e., a graphics processing unit, GPU). When the electronic device 304 is in operation, the heats generated by the heating element 306 would be conducted to the boiler plate 302. In some embodiments, as shown in FIG. 1B, each of the immersion units 30 further comprises a body handle 32. The body handle 32 is on one side of the main body frame 300, and the side is away from the lower portion of the main body frame 300. Hence, in some embodiments, through the body handle 32, the rack-mounted immersion units 30 can be taken out from, for example, the cabinet 22 or the cooling tank 20. Alternatively, in some embodiments, the rack-mounted immersion unit 30 can be received in, for example, the cabinet 22 or the cooling tank 20 conveniently. To illustrate each of the embodiments more clearly, in the instant disclosure, the body handle 32 is omitted and not shown in black line in the figures other than FIG. 1B.

Please refer to FIG. 2. In operation, the heat transfer fluid 50 can be received in the receiving portion 200 and at least submerge the boiler plate 302. Hence, the receiving portion 200 comprises a gas-phase space V and a liquid-phase space L. That is, in this embodiment, the liquid-phase space L is a space where the heat transfer fluid 50 is received in the receiving portion 200. When the boiler plate 302 physically contacts the heat transfer fluid 50, the heats of the boiler plate 302 can be conducted to the heat transfer fluid 50. The heat transfer fluid 50 is a non-conductive fluid with a boiling point being less than or equal to a working temperature of the boiler plate 302. Therefore, the critical boiling point of the heat transfer fluid 50 would be quickly reached by absorbing the heats to further vaporize the heat transfer fluid 50, so that a large number of bubbles would be generated. Next, the bubbles would flow upward due to buoyancy, and through the guiding channel with a narrower width divided by the baffle assembly 40, the bubbles in a large amount would pass through the narrower guiding channel with a much higher velocity. Therefore, the flow velocity of the bubbles in a proximity of the guiding channel to further pass through the guiding channel can be enhanced. The bubbles would escape to the gas-phase space V from the proximity of the boiler plate 302 of the inner lower portion 204, through the inner upper portion 202 (along the second direction D2 and the first direction D1). Hence, in some embodiments, through the narrower guiding channel that accelerates the flow velocity of the bubbles in the proximity of the guiding channel, the bubbles in a large amount can be prevented from being attached or accumulating to the proximity of the boiler plate 302 of the immersion cooling system 10. In addition, in some embodiments, the overall cooling performance of the immersion cooling system 10 can also be prevented from being affected by the reduced contact possibilities between the boiler plate 302 and the liquid-phase heat transfer fluid 50.

In some embodiments, the immersion cooling system 10 further comprises a condensation device 60 comprising a condenser 600, a pump 606, and a heat exchanger 608. The condenser 600 is above the surface of the heat transfer fluid 50. Referring to FIG. 1A, the condenser 600 is in the gas-phase space V of the receiving portion 200. Through a first condensation pipe 602 and a second condensation pipe 604, the pump 606 allows a heat exchange fluid to be circulated between the heat exchanger 608 and the condenser 600. The heat exchange fluid may be, but not limited to, water. When the immersion cooling system 10 is in operation, the gas-phase heat transfer fluid 50 escaping to the gas-phase space V from the inner upper portion 202 would contact the surface of the condenser 600. Since the surface temperature of the condenser 600 is lower than the temperature of the heat transfer fluid 50, the heats would be transferred from the gas-phase heat transfer fluid 50 to the condenser 600. The gas-phase heat transfer fluid 50 would be then condensed into the liquid-phase heat transfer fluid 50 after the temperature of the gas-phase heat transfer fluid 50 is reduced. The liquid-phase heat transfer fluid 50 would then drop back to the heat transfer fluid 50 received in the liquid-phase space L. After the condenser 600 absorbs the heats of the gas-phase heat transfer fluid 50, the heats would be further guided to the heat exchanger 608 by the heat exchange fluid. Then, after the temperature of the heat exchange fluid is reduced, the heat exchange fluid would be guided back to the condenser 600.

Please refer to FIG. 3A. FIG. 3A illustrates a schematic working view in a first view (i.e., the XY plane) of a single immersion unit 30 of the immersion cooling system 10 shown in FIG. 2. In FIG. 3A, the electronic device 304 and the baffle assembly 40 are respectively fixed to the main body frame 300. The heating element 306 of the electronic device 304 contacts the boiler plate 302. In some embodiments, the immersion unit 30 further comprises a bracket 308 fixed to the boiler plate 302, and the boiler plate 302 is maintained by the bracket 308 to normally contact the heating element 306. The bracket 308 may be fixed to the electronic device 304, the main body frame 300, or a combination of the electronic device 304 and the main body frame 300. In some embodiments, the material of the bracket 308 may be, but not limited to, Bakelite, metal, plastic, or combinations comprising any two or more thereof.

Figure 3B:
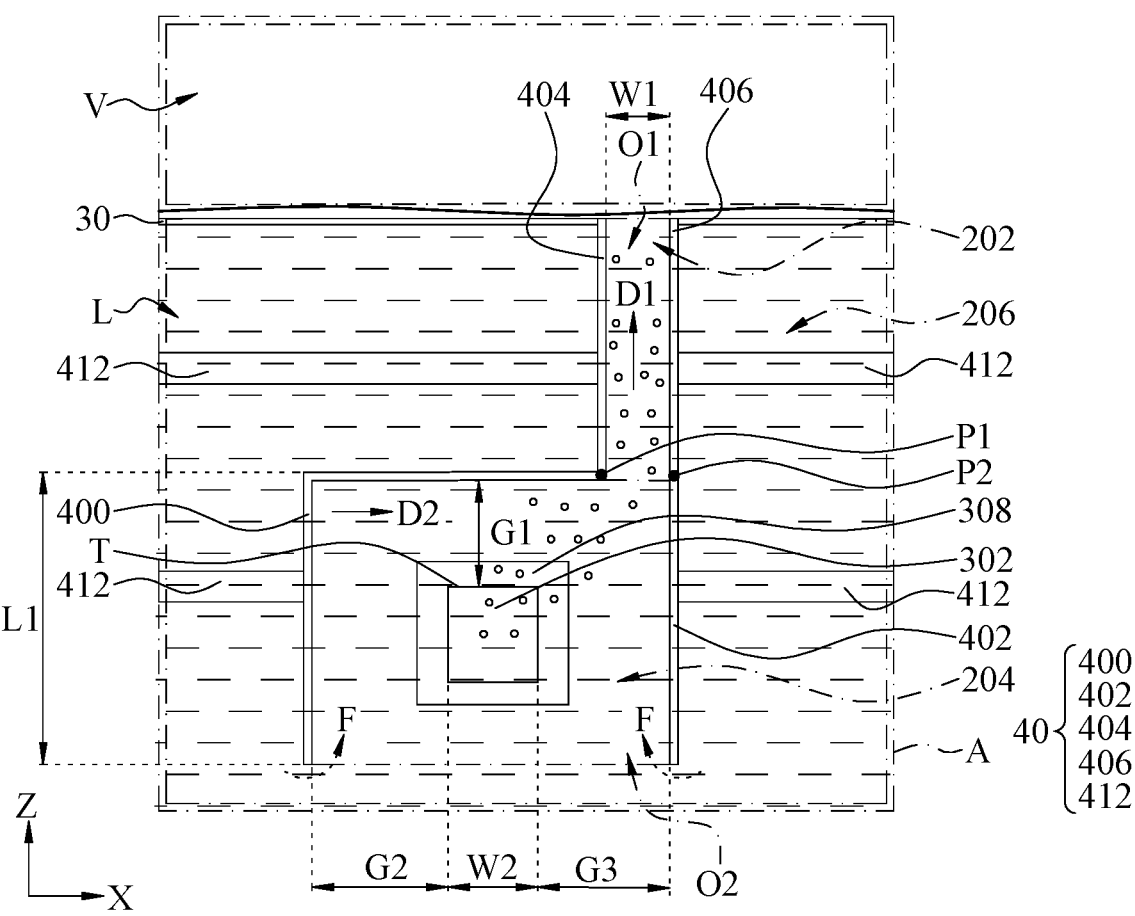
FIG. 3B illustrates a schematic working view in a second view (i.e., the XZ plane) of a single immersion unit of the immersion cooling system shown in FIG. 2.

Please refer to FIG. 2 and FIG. 3B at the same time. FIG. 3B illustrates a schematic working view in a second view (i.e., the XZ plane) of a single immersion unit 30 of the immersion cooling system 10 shown in FIG. 2. In some embodiments, the baffle assembly 400 comprises two side plates 400, 402 and two guiding plates 404, 406. The two side plates 400, 402 are respectively at opposite sides of the boiler plate 302. A section between the two side plates 400, 402 is the inner lower portion 204. One of two ends of each of the two guiding plates 404, 406 is connected to a corresponding one of the two side plates 400, 402, and a section between the two guiding plates 404, 406 is the inner upper portion 202. Connection portions P1, P2 are respectively between each of the two side plates 400, 402 and a corresponding one of the two guiding plates 404, 406. That is, the side plate 400 and the guiding plate 404 are connected by the connection portion P1, and the side plate 402 and the guiding plate 406 are connected by the connection portion P2. A first gap G1 is between the boiler plate 302 and the connection portion P1 (or the connection portion P2). The first gap G1 may be, but not limited to, any value ranging between 20 mm and 30 mm. A second gap G2 is between the boiler plate 302 and the side plate 400. A third gap G3 is between the boiler plate 302 and the side plate 402. The second gap G2 and the third gap G3 may independently be, but not limited to, any value ranging between 20 mm and 30 mm. The materials of the two side plates 400, 402 and the two guiding plates 404, 406 may independently be, but not limited to, metal, plastic, or a combination of metal and plastic. The two side plates 400, 402 and the two guiding plates 404, 406 may be permanently or detachably fixed to the main body frame 300. For example, the two side plates 400, 402 and the two guiding plates 404, 406 may be independently fixed to the cooling tank 20 (as shown in FIG. 1A) by latching. In the embodiments shown in FIG. 3B, the side plate 400 is an L-shaped plate. In some embodiments, the baffle assembly 40 further comprises one or more baffle supports 412 respectively connected to the two side plates 400, 402 and the two guiding plates 404, 406. Therefore, the two side plates 400, 402 and the two guiding plates 404, 406 can be fixed in the immersion unit 30 without an apparent displacement with respect to the boiler plate 302. The material of the baffle support 412 may be, but not limited to, metal, plastic, or a combination of metal and plastic.

Figure 3C:
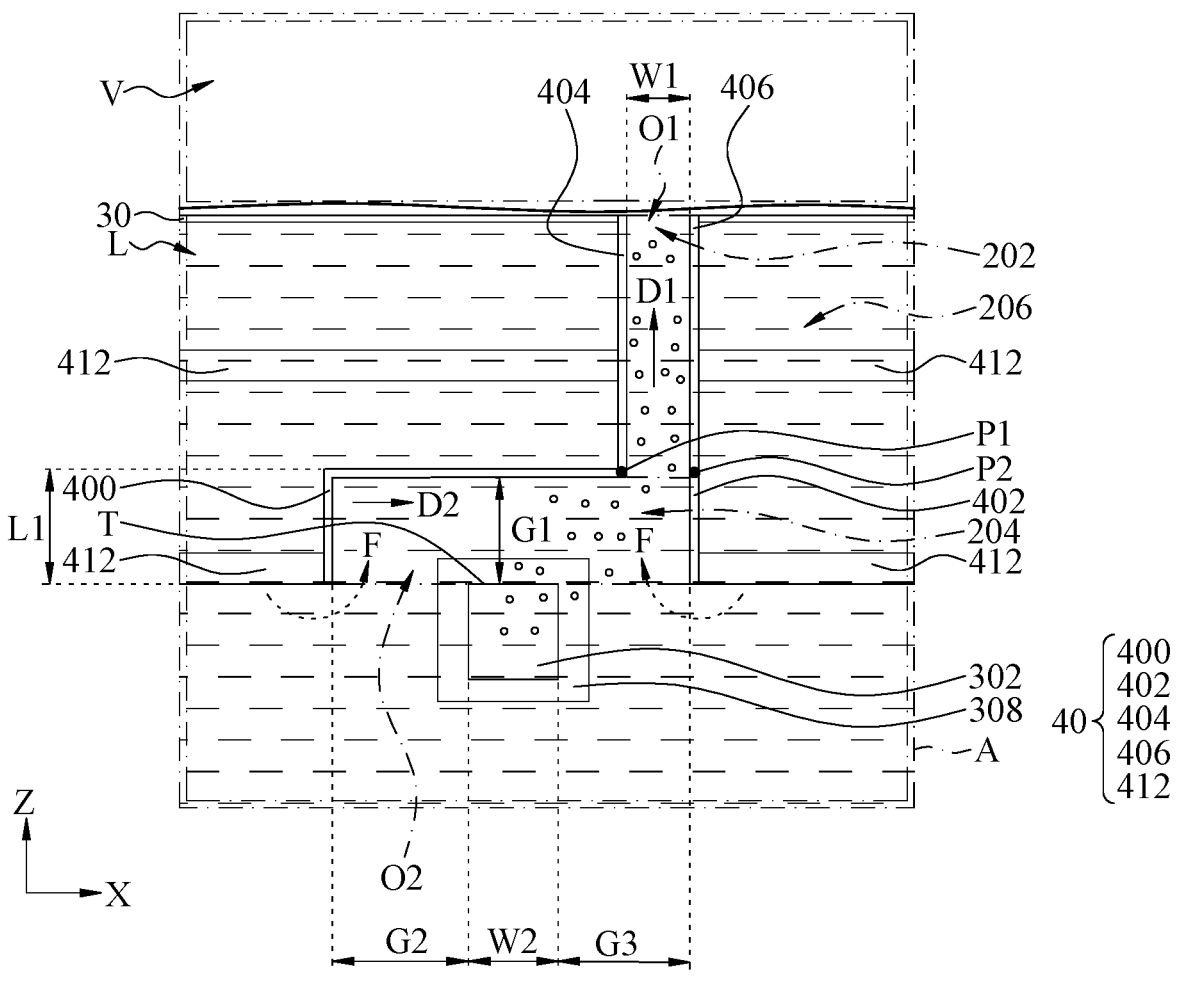
FIG. 3C illustrates a schematic working view in the second view (i.e., the XZ plane) of a single immersion unit of the immersion cooling system shown in FIG. 2.

In some embodiments, positions of the connection portions P1, P2 of the two side plates 400, 402 and the two guiding plates 404, 406 are higher than or equal to the position of a top edge T of the boiler plate 302. Referring to FIG. 3B, in some embodiments shown in FIG. 3B, the positions of the connection portions P1, P2 of the two side plates 400, 402 and the two guiding plates 404, 406 are higher than the position of the top edge T of the boiler plate 302. In other words, a gap (i.e., the first gap G1) between the boiler plate 302 and the connection portion P1 (or the connection portion P2) is less than the length L1 of the side plate 400 (or the side plate 402). Alternatively, referring to FIG. 3C, FIG. 3C illustrates a schematic working view in the second view (i.e., the XZ plane) of a single immersion unit 30 of the immersion cooling system 10 shown in FIG. 2. In some embodiments, as shown in FIG. 3C, the first gap G1 between the boiler plate 302 and the connection portion P1 (or the connection portion P2) is equal to the length L1 of the side plate 400 (or the side plate 402). As to a further option, in some embodiments, the positions of the connection portions P1, P2 of the two side plates 400, 402 and the two guiding plates 404, 406 are substantially equal to the position of the top edge T of the boiler plate 302. In other words, the first gap G1 between the boiler plate 302 and the connection portion P1 (or the connection portion P2) is equal to the length L1 of the side plate 400 (or the side plate 402), and the first gap G1 may even be configured to be zero and substantially equal to zero.

Please refer to FIG. 3B. In some embodiments, the inner upper portion 202 has a first opening O1. The inner lower portion 204 has a second opening O2 at one side of the inner lower portion 204 that is away from the first opening O1. In other words, in some embodiments, as shown in FIG. 3B, the second opening O2 is an opening having a width equal to the sum of the second gap G2, the width W2 of the boiler plate 302, and the third gap G3. The width of the first opening O1 can serve as the width W1 of the inner upper portion 202. The gas-phase heat transfer fluid 50 flows along the second direction D2 and the first direction D1 to further escape to the gas-phase space V from the first opening O1. The height of the first opening O1 and the surface of the heat transfer fluid 50 (i.e., the interface between the liquid-phase space L and the gas-phase space V) can be substantially aligned with each other. Alternatively, in some embodiments, the height of the first opening O1 can be higher than the surface of the heat transfer fluid 50 (as shown in FIG. 3B) or lower than the surface of the heat transfer fluid 50. Therefore, the configuration of the height of the first opening O1 and the surface of the heat transfer fluid 50 is not particularly limited herein. The heat transfer fluid 50 continues to flow into the inner lower portion 204 through the second opening O2 along filling directions F, so that the amount of the heat transfer fluid 50 received in the inner lower portion 204 can be maintained at a specific amount. Hence, the overall heat transfer rate of the heat transfer fluid 50 would not be apparently affected. In some embodiments, the condenser 600 (as shown in FIG. 1A) is vertically (e.g., along the Z direction shown in FIG. 3B) above the first opening O1, so that the gas-phase heat transfer fluid 50 may contact the condenser 600 more directly to further enhance the cooling performance of the condenser 600.

Figure 5:
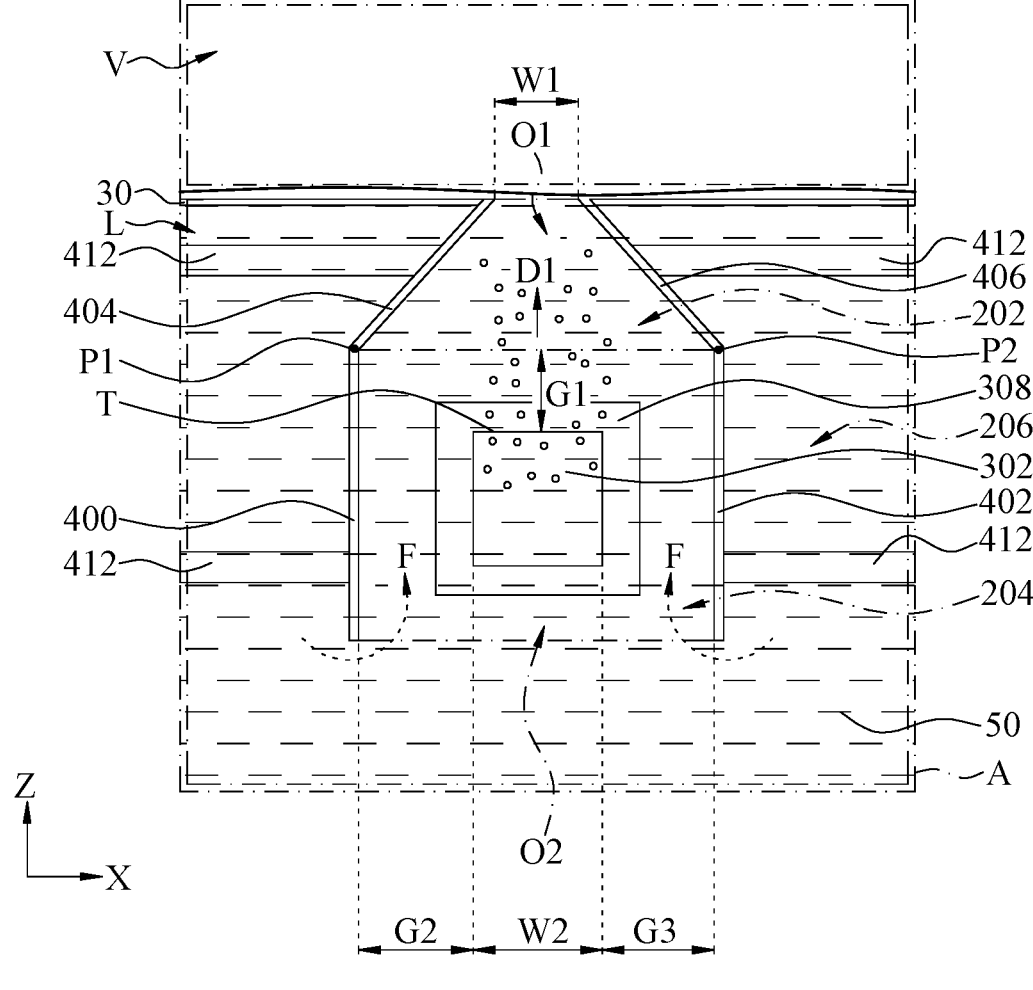
FIG. 5 illustrates a schematic working view in the second view (i.e., the XZ plane) of a single immersion unit of the immersion cooling system according to some embodiments.
Figure 6:
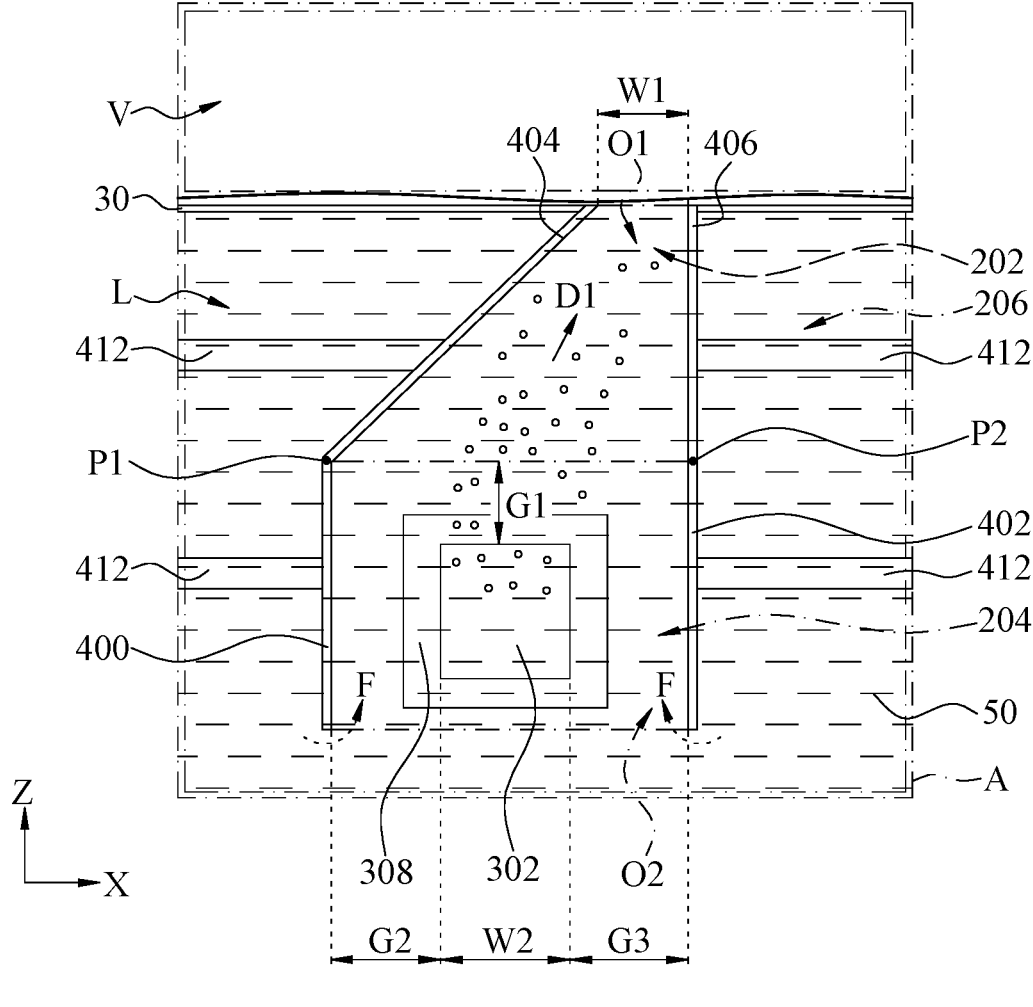
FIG. 6 illustrates a schematic working view in the second view (i.e., the XZ plane) of a single immersion unit of the immersion cooling system according to some embodiments.

In some embodiments, a distance between the two guiding plates 404, 406 gradually decreases from bottom portions of the two guiding plates 404, 406 to top portions of the two guiding plates 404, 406. Please refer to FIG. 5 and FIG. 6. FIG. 5 and FIG. 6 respectively illustrate schematic working views in the second view (i.e., the XZ plane) of a single immersion unit 30 of the immersion cooling system 10 according to some embodiments. In FIG. 5 and FIG. 6, the distance between the two guiding plates 404, 406 gradually decreases from bottom portions of the two guiding plates 404, 406 to top portions of the two guiding plates 404, 406, so that the width W1 of the first opening O1 is less than the width of the bottom portions of the two guiding plates 404, 406 (i.e., the distance between the two connection portions P1, P2). Therefore, in some embodiments, through the configuration of two guiding plates 404, 406, the guiding channel which guides the bubbles in a large amount to escape to the gas-phase space V may be thus divided from the receiving portion 200.

Figure 7:
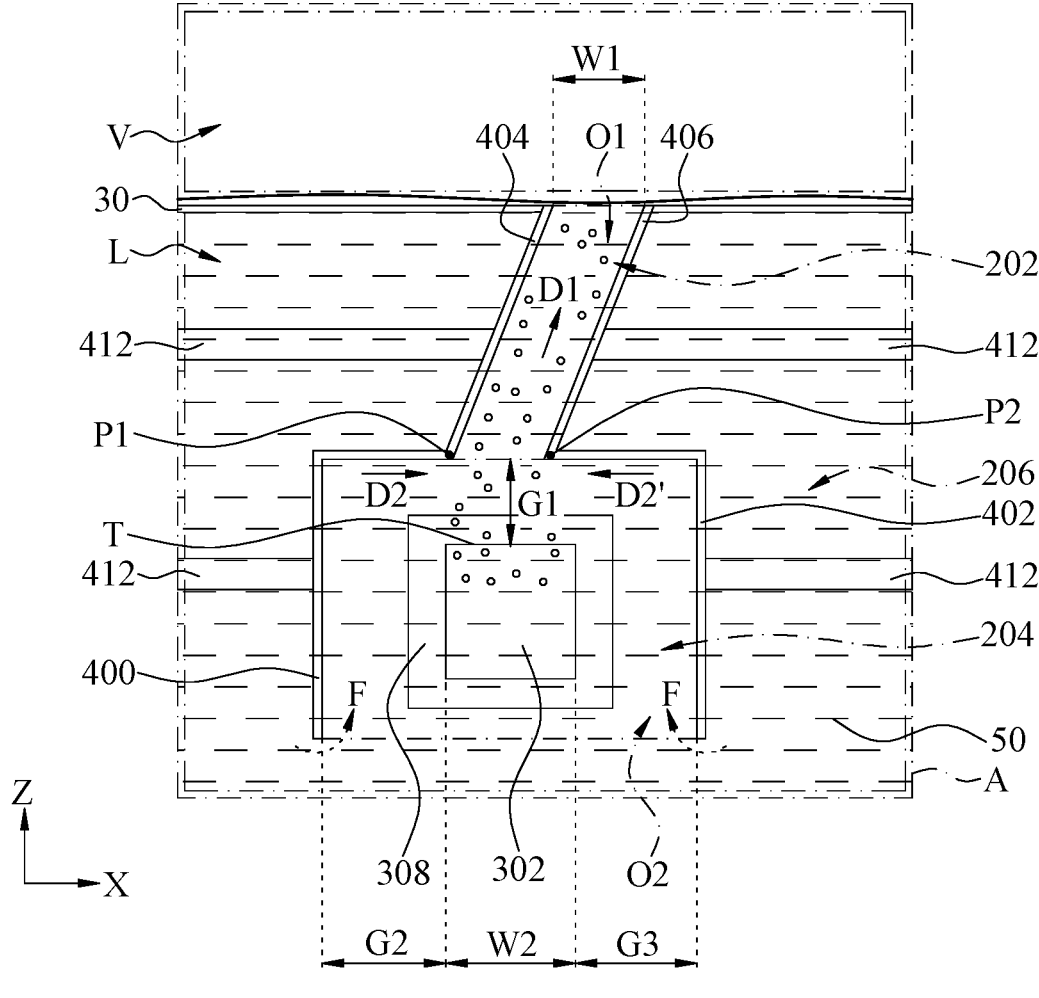
FIG. 7 illustrates a schematic working view in the second view (i.e., the XZ plane) of a single immersion unit of the immersion cooling system according to some embodiments.

In some embodiments, the two guiding plates 404, 406 are parallel or substantially parallel to each other. Please refer to FIG. 7. FIG. 7 illustrates a schematic working view in the second view (i.e., the XZ plane) of a single immersion unit 30 of the immersion cooling system 10 according to some embodiments. In some embodiments, as shown in FIG. 7, the two guiding plates 404, 406 are parallel to each other. The channel direction (e.g., the first direction D1 shown in FIG. 7) of the inner upper portion 202 divided by the two guiding plates 404, 406 is different from the channel direction (e.g., the first direction D1 shown in FIG. 3B) of the inner lower portion 204 divided by the two side plates 400, 402. Hence, in some embodiments, through the configuration of two guiding plates 404, 406, the guiding channel which guides the bubbles in a large amount to escape to the gas-phase space V may be thus divided from the receiving portion 200. In some embodiments, the inner upper portion 202 having various channel directions may be provided by the two guiding plates 404, 406. For example, the inner upper portion 202 is an N-shape guiding channel.

Figure 8:
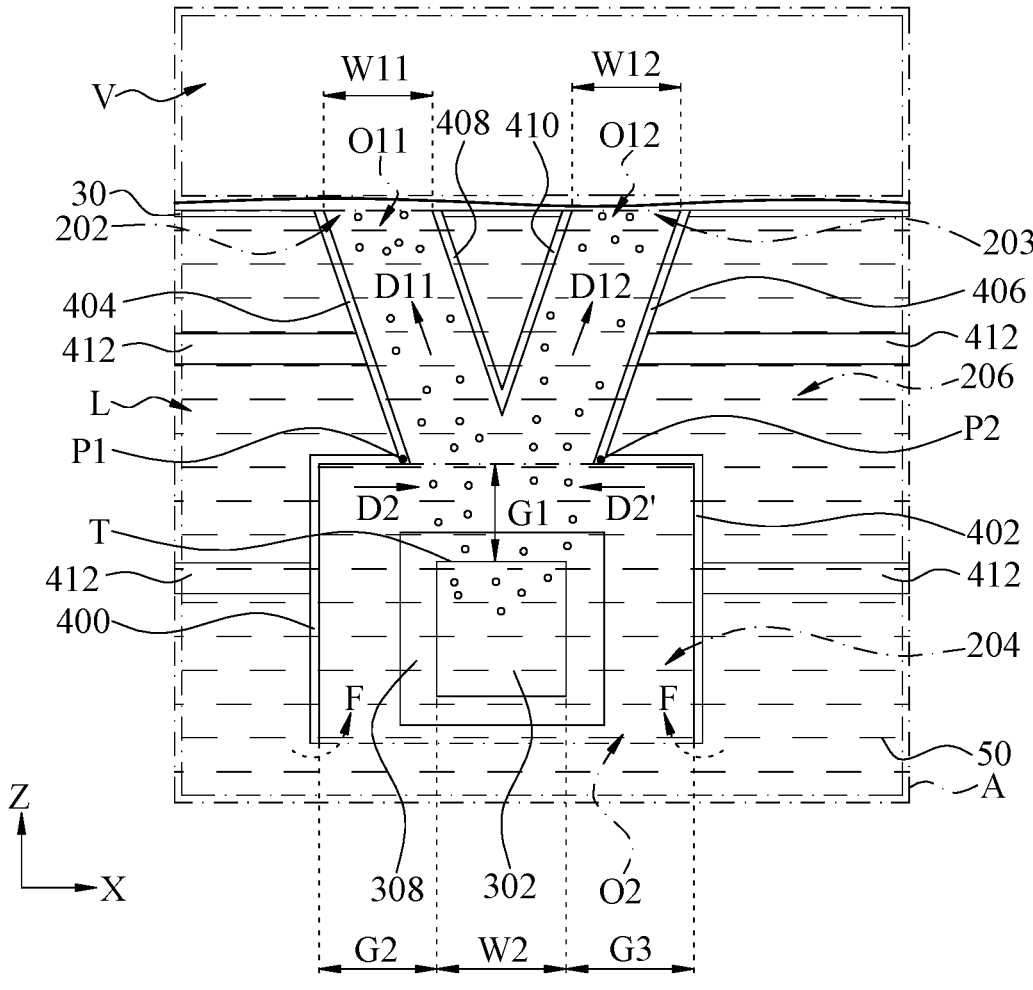
FIG. 8 illustrates a schematic working view in the second view (i.e., the XZ plane) of a single immersion unit of the immersion cooling system according to some embodiments.
Figure 9:
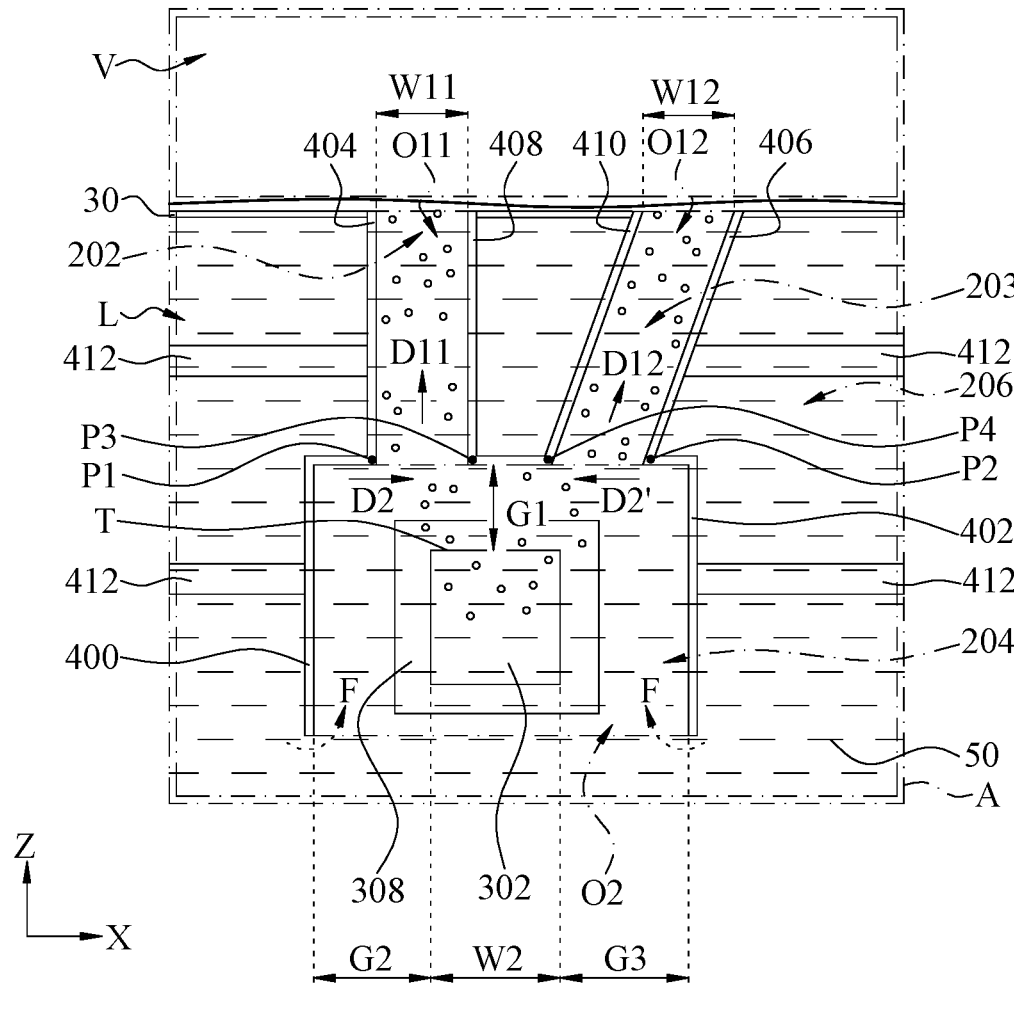
FIG. 9 illustrates a schematic working view in the second view (i.e., the XZ plane) of a single immersion unit of the immersion cooling system according to some embodiments.

Please refer to FIG. 8 and FIG. 9. FIG. 8 and FIG. 9 respectively illustrate schematic working views in the second view (i.e., the XZ plane) of a single immersion unit 30 of the immersion cooling system 10 according to some embodiments. The baffle assembly 40 comprises a plurality of sub-guiding plates 408, 410. The sub-guiding plates 408, 410 correspond to the two guiding plates 404, 406 to obtain a plurality of the inner upper portions 202, 203 divided from the receiving portion 200. That is, a section between the guiding plate 404 and the sub-guiding plate 408 is the inner upper portion 202 and a section between the guiding plate 406 and the sub-guiding plate 410 is the inner upper portion 203.

In FIG. 8, the top side of the baffle assembly 40 (i.e., the side of the baffle assembly 40 adjacent to the surface of the heat transfer fluid 50) has a plurality of sub-guiding plates 408, 410 to obtain a plurality of the inner upper portions 202, 203 divided from the receiving portion 200. The inner upper portion 202 has a third opening O11 and the inner upper portion 203 has a fourth opening O12. The width W11 of the third opening O11 and the width W12 of the fourth opening O12 correspond to the width W1 of the inner upper portion 202 described above, and the widths W11, W12 may also be independently less than or equal to the width W2 of the boiler plate 302. In addition, the channel directions of the inner upper portions 202, 203 are respectively the third direction D11 and the fourth direction D12. Both the third direction D11 and the fourth direction D12 are different from the channel direction of the inner lower portion 204 (e.g., the first direction D1 shown in FIG. 3B). The inner upper portions 202, 203 together form a V-shape channel with two sub-channels being in communication with each other. Hence, in some embodiments, as shown in FIG. 8, the bubbles in the left side of the inner lower portion 204 may flow along the second direction D2, through the inner upper portion 202 (and the third opening O11) or the inner upper portion 203 (and the fourth opening O12), to further escape to the gas-phase space V. Meanwhile, in some embodiments, as shown in FIG. 8, the bubbles in the right side of the inner lower portion 204 may flow along a direction D2' (opposite to the second direction D2), through the inner upper portion 202 (and the third opening O11) or the inner upper portion 203 (and the fourth opening O12), to further escape to the gas-phase space V. Therefore, the guiding channels having various channel directions can be provided in the same embodiment by the two guiding plates 404, 406 and the two sub-guiding plates 408, 410, so that the bubbles can be guided to further escape to the gas-phase space V.

In FIG. 9, the channel directions of the inner upper portions 202, 203 are respectively the third direction D11 and the fourth direction D12. For example, in the embodiments shown in FIG. 9, the third direction D11 is identical to the direction of the inner lower portion 204 (e.g., the first direction D1 shown in FIG. 3B) and the fourth direction D12 is different from the channel direction of the inner lower portion 204. The inner upper portions 202, 203 together form a roughly V-shape channel with the two sub-channels being not in direct communication with each other. In other words, in some embodiments, the sub-guiding plate 408 is connected to the two side plate 400 through a connection portion P3, the sub-guiding plate 410 is connected to the two side plate 402 through a connection portion P4, and the two connection portions P3, P4 are not overlapped with each other. Therefore, the guiding channels having various channel directions are provided in the same embodiment by the two guiding plates 404, 406 and the two sub-guiding plates 408, 410, so that the bubbles can be guided to further escape to the gas-phase space V.

Please refer to FIG. 3A and FIG. 4. FIG. 4 illustrates a schematic working view in the first view (i.e., the XY plane) of a single immersion unit 30 of the immersion cooling system 10 shown in FIG. 2. In some embodiments, the baffle assembly 40 has a height H1 along a direction toward the boiler plate 302 (e.g., the +Y directions shown in FIG. 3A and FIG. 4). In some embodiments, the height H1 may be greater than the surface of the boiler plate 302 (i.e., the upper surface of the boiler plate 302 shown in FIG. 3A and FIG. 4). Alternatively, in some embodiments, the bottom side of the baffle assembly 40 and the surface of the boiler plate 302 are substantially aligned with each other. As to a further option, in some embodiments, in the vertical direction shown in the view of FIG. 4 (i.e., the Y direction shown in FIG. 3A and FIG. 4), a short gap is between the main body frame 300 and the boiler plate 302. As shown in both FIG. 3A and FIG. 4, a fourth gap G4 is between the surface of the boiler plate 302 and the main body frame 300. The height H1 of the baffle assembly 40 may be greater than, equal to, or slightly less than the fourth gap G4. The fourth gap G4 may be, but not limited to, any value ranging between 10 mm and 30 mm. Therefore, in some embodiments, through the configuration of the baffle assembly 40, most of the bubbles can be ensured to flow inside the inner lower portion 204 and the corresponding guiding channel divided by the baffle assembly 40. Meanwhile, the heat transfer fluid 50 can continuously flow into the inner lower portion 204 through the gap between the baffle assembly 40 and the bottom side of the boiler plate 302 along the filling directions F. Hence, the amount of the heat transfer fluid 50 received in the inner lower portion 204 can be maintained at a specific amount and thus the overall heat transfer rate of the heat transfer fluid 50 would not be apparently affected.

In FIG. 3A, the height H1 of the baffle assembly 40 is greater than the gap (i.e., the fourth gap G4) between the boiler plate 302 and the surface of the cooling tank 20 (i.e., the upper portion of the main body frame 300 shown in FIG. 3A). In FIG. 4, the height H1 of the baffle assembly 40 is substantially greater than the gap (i.e., the fourth gap G4) between the boiler plate 302 and the surface of the cooling tank 20 (i.e., the upper portion of the main body frame 300 shown in FIG. 4). Hence, through adjusting the relative position between the baffle assembly 40 and the boiler plate 302, various inner lower portions 204 and the corresponding guiding channels that can directly or indirectly control the flow of the heat transfer fluid 50 and the bubbles may be provided.

In some embodiments, as shown in FIG. 4, the main body frame 300 has a hollow portion 301. For example, the hollow portion 301 is a portion on the upper side of the main body frame 300 and between the two side plates 400, 402. Hence, the heat transfer fluid 50 may flow into the inner lower portion 204 of the baffle assembly 40 through the hollow portion 301.

Figures 10, 11:
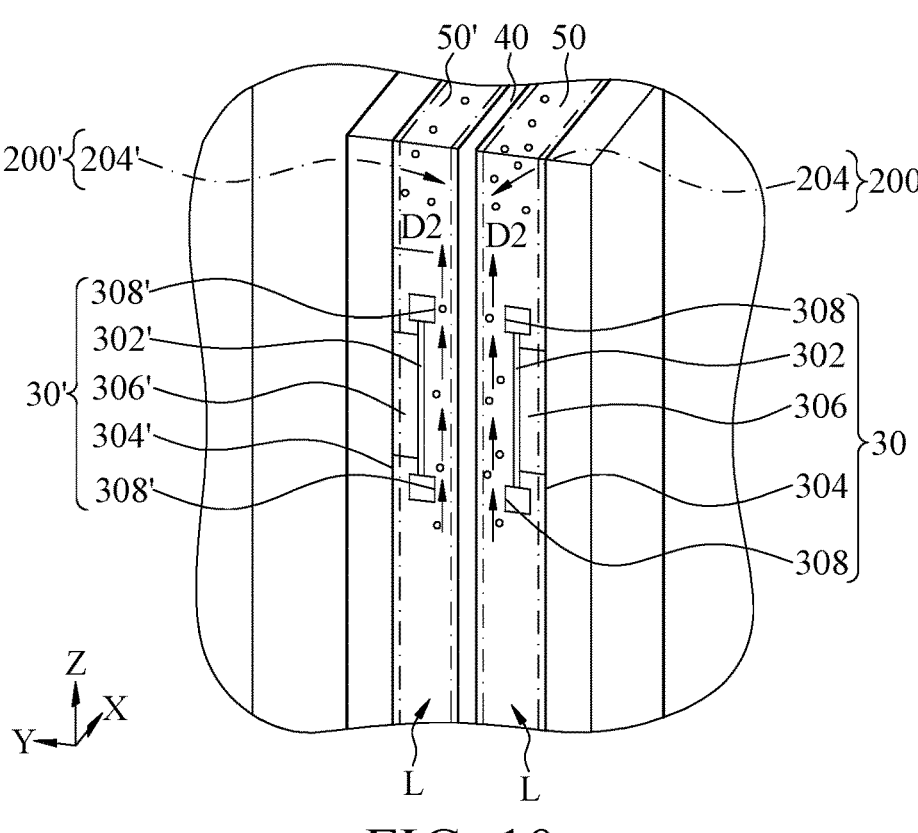
FIG. 10 illustrates a schematic working view of a plurality of immersion units of the immersion cooling system according to some embodiments.
FIG. 11 illustrates a schematic working view of a plurality of immersion units of the immersion cooling system according to some embodiments.

In some embodiments, the immersion cooling system 10 comprises a plurality of immersion units 30, 30'. The baffle assembly 40 has two sides opposite to each other. The baffle assembly 40 divides the receiving portion 200 (which may be referred to FIG. 2 and FIG. 3B) into two sub receiving portions (e.g., the two receiving portions 200, 200' shown in FIG. 10) at the two sides of the baffle assembly 40. Each of the two sub receiving portions (e.g., the two receiving portions 200, 200' shown in FIG. 10) has the inner upper portion 202 (or the inner upper portion 202'; both of which are not denoted in FIG. 10 but may be referred to FIG. 2 and FIG. 3B), the inner lower portion 204 (or the inner lower portion 204'), and the peripheral portion 206 (or the peripheral portion 206'; both of which are not denoted in FIG. 10 but may be referred to FIG. 2 and FIG. 3B). The inner upper portion 202 (or the inner upper portion 202'), the inner lower portion 204 (or the inner lower portion 204'), and the peripheral portion 206 (or the peripheral portion 206') at each of the two sides of the baffle assembly 40 are in communication with each other. The boiler plates 302 at each of the two sides of the baffle assembly 40 are in the inner lower portions 204. Please refer to FIG. 10. FIG. 10 illustrates a schematic working view of a plurality of immersion units 30, 30' of the immersion cooling system 10 according to some embodiments (to illustrate the embodiments more clearly, in the instant disclosure, the heat transfer fluids 50, 50' in FIG. 10 are omitted to be shown in black lines). In FIG. 10, the immersion cooling system 10 comprises two immersion units 30, 30'. The immersion unit 30 comprises a boiler plate 302, and the immersion unit 30' comprises a boiler plate 302'. The boiler plates 302, 302' may be respectively referred to the boiler plate 302 described above, and thus will not be described in detail herein). The two boiler plates 302, 302' share the same baffle assembly 40. For example, receiving portions 200, 200' are respectively formed at the two opposite sides of the baffle assembly 40. The baffle assembly 40 and the receiving portions 200, 200' at the two sides of the baffle assembly 40 may be respectively referred to the baffle assembly 40 and the receiving portion 200 described above, and thus will not be described in detail herein. The heat transfer fluids 50, 50' are also respectively received in the corresponding receiving portions 200, 200' and at least submerge the boiler plates 302, 302'. The heat transfer fluids 50, 50' may be respectively referred to the heat transfer fluid 50 described above and thus will not be described in detail herein. In addition, in some embodiments, likewise, the immersion units 30 may comprise an electronic device 304, a heating element 306, and a bracket 308, and the immersion unit 30' may comprise an electronic device 304', a heating element 306', and a bracket 308'. The electronic devices 304, 304', the heating elements 306, 306', and the brackets 308, 308' may be respectively referred to the electronic device 304, the heating element 306, and the bracket 308 described above and thus will not be described in detail herein. Accordingly, in some embodiments, by densely stacking a plurality of boiler plates 302, 302', a plurality of electronic devices 304, 304', a plurality of heating elements 306, 306', and a plurality of brackets 308, 308' (which share the same baffle assembly 40), more elements and devices to be cooled can be quickly cooled in the limited cooling space. Hence, in some embodiments, the heat transfer rates between the elements to be cooled and the heat transfer fluids 50, 50' can be prevented from being affected by the bubbles generated in a large amount. Therefore, in some embodiments, the utilization rate of the limited cooling space of the immersion cooling system 10 can be improved, and the elements and devices to be cooled can be configured more densely, thereby enhancing the working performance of the overall elements and devices (e.g., enhancing the overall power density).

In some embodiments, the immersion cooling system 10 comprises a plurality of immersion units 30, 30' and a plurality of baffle assemblies 40, 40'. Each of the immersion units 30, 30' corresponds to a corresponding one of the baffle assemblies 40, 40'. The boiler plate 302 (or the boiler plate 302') of each of the immersion units 30, 30' is at a portion of the inner lower portion 204 (or the inner lower portion 204') of the receiving portion 40 (or the receiving portion 40') corresponding to a corresponding one of the corresponding baffle assemblies 40, 40'. FIG. 11 illustrates a schematic working view of a plurality of immersion units 30, 30' of the immersion cooling system 10 according to some embodiments (to illustrate the embodiments more clearly, in the instant disclosure, the heat transfer fluids 50, 50' in FIG. 11 are omitted to be shown in black lines). In FIG. 11, the immersion cooling system 10 comprises two immersion units 30, 30'. The immersion unit 30 comprises a boiler plate 302 and the immersion unit 30' comprises a boiler plate 302'. The two boiler plates 302, 302' respectively correspond to the corresponding baffle assemblies 40, 40'. The receiving portions 200, 200' are respectively divided by the baffle assemblies 40, 40'. The boiler plates 302, 302', the baffle assemblies 40, 40', and the receiving portions 200, 200' may be respectively referred to the boiler plate 302, the baffle assembly 40, and the receiving portion 200 described above and thus will not be described in detail herein. In addition, in some embodiments, the heat transfer fluids 50, 50', the electronic devices 304, 304', the heating elements 306, 306', and the brackets 308, 308' may be respectively referred to the electronic device 304, the heating element 306, and the bracket 308 described above and thus will not be described in detail herein. Hence, in some embodiments, by densely stacking a plurality of boiler plates 302, 302', a plurality of electronic devices 304, 304', a plurality of heating elements 306, 306', a plurality of brackets 308, 308', and a plurality of baffle assemblies 40, 40', more elements and devices to be cooled of the immersion cooling system 10 can be quickly cooled in the limited cooling space. Hence, in some embodiments, the heat transfer rates between the elements to be cooled and the heat transfer fluids 50, 50' can be prevented from being affected by the bubbles generated in a large amount. Therefore, in some embodiments, the utilization rate of the limited cooling space of the immersion cooling system 10 can be improved, and the elements and devices to be cooled can be configured more densely, thereby enhancing the working performance of the overall elements and devices (e.g., enhancing the overall power density).

In some embodiments, the immersion cooling system 10 comprises a plurality of immersion units 30, 30', which can be assembled by referring to the implementations described in FIG. 10, FIG. 11, or a combination of FIG. 10 and FIG. 11, and thus more various assembly embodiments thereof can be provided. It is noted that even though the corresponding figures are not further illustrated herein, the above embodiments should all be included in the embodiments of the instant disclosure. Hence, in some embodiments, the utilization rate of the limited cooling space can be enhanced, and the elements and devices to be cooled can be configured more densely, thereby enhancing the working performance of the overall elements and devices (e.g., enhancing the overall power density).

Figure 12:
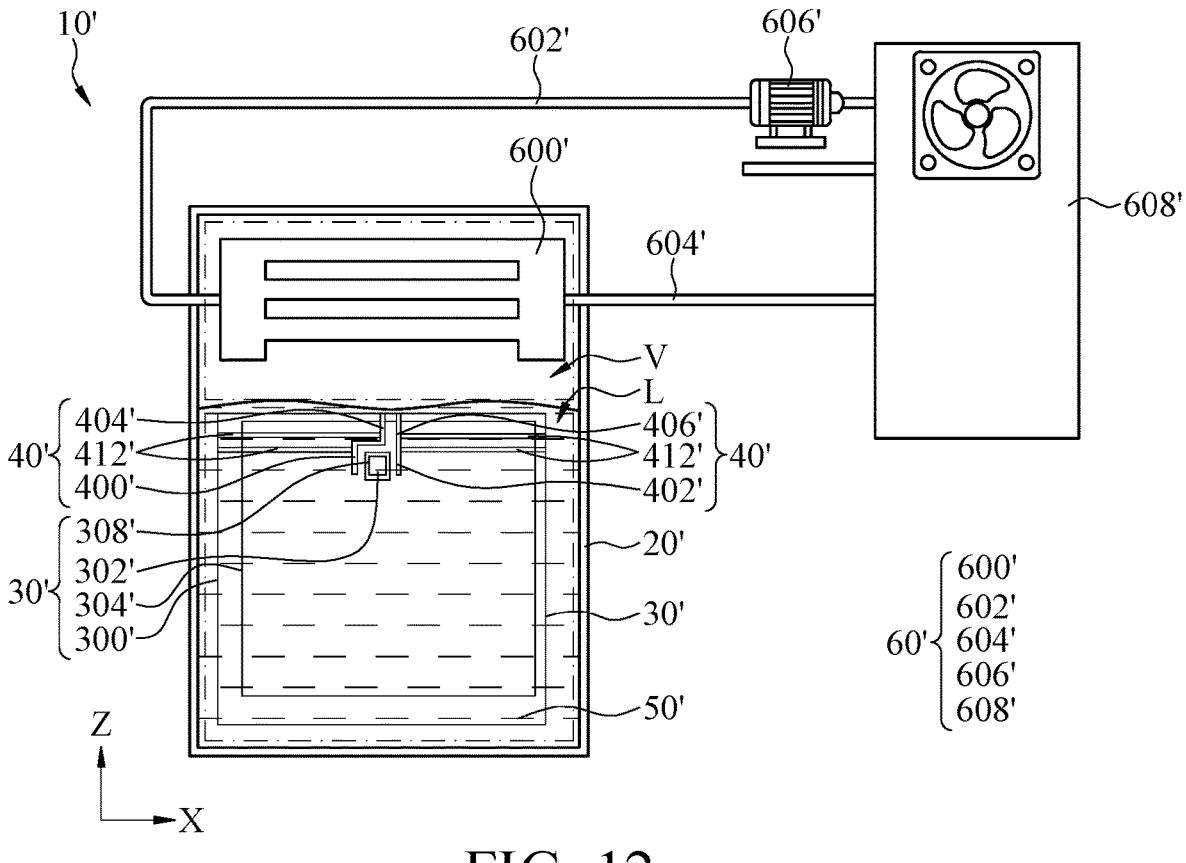
FIG. 12 illustrates a schematic working view of a single immersion unit of the immersion cooling system applied to a rack-mounted server system according to some embodiments.

In some embodiments, the immersion unit 30 is a single rack-mounted server unit. Please refer to FIG. 12. FIG. 12 illustrates a schematic working view of a single immersion unit 30' of the immersion cooling system 10' applied to a rack-mounted server system according to some embodiments. The cooling tank 20' has a receiving portion 200 (which may be referred to FIG. 2 and thus is not further denoted in FIG. 12). The main body frame 300' of the immersion unit 30' is a closed-type frame. The inner upper portion 202, the inner lower portion 204, and the peripheral portion 206 (which are in communication with each other) of the receiving portion 200 (which may be referred to FIG. 2 and thus are not further denoted in FIG. 12) are divided by the baffle assembly 40'. The heating element 306' (which may be referred to the heating element 306 described above as well as shown in FIG. 3A and FIG. 4) of the immersion unit 30' contacts the boiler plate 302'. When the electronic device 304' of the immersion unit 30' is in operation, since the gas-phase heat transfer fluid 50' contacting the boiler plate 302' is vaporized by absorbing the heats, a large number of bubbles vaporized from the gas-phase heat transfer fluid 50' would be guided by the baffle assembly 40' to further escape to the gas-phase space V and be condensed upon contacting the condenser 600' in the gas-phase space V. Hence, in some embodiments, through the guiding by the two side plates 400', 402' and the two guiding plates 404', 406', the gas-phase heat transfer fluid 50' not only can leave more quickly from the boiler plate 302' but also can contact the condenser 600' more directly. Therefore, the overall cooling performance of the condenser 600' can be enhanced. The elements described herein (in some embodiments, in which the immersion cooling system may further comprise the bracket 308', the baffle support 412', the condensation device 60', the first condensation pipe 602', the second condensation pipe 604', the pump 606', and the heat exchanger 608') and the corresponding implementations may be referred to the elements and the corresponding implementations described above and thus will not be described in detail herein.

To sum up, in some embodiments, a boiler plate is in an inner lower portion divided by a baffle assembly. Bubbles of the heat transfer fluid generated in operation could be guided through the inner lower portion and an inner upper portion that are divided by the baffle assembly so as to further escape to a gas-phase space efficiently. Hence, the bubbles in a large amount can be prevented from being attached or accumulated at the surface of the boiler plate or the proximity of the boiler plate (or even randomly flowing to other locations in the heat transfer fluid). Therefore, the heats of the boiler plate can be removed more efficiently. Furthermore, in some embodiments, through improving conditions of the bubbles (such as staying in place or flowing to other locations in the heat transfer fluid), pollutants generated at the surface or the proximity of the boiler plate can be also removed at the same time. Therefore, the pollutants that would further affect the cooling performance of the boiler plate can be prevented from being accumulated at the surface or the proximity of the boiler plate. Hence, in some embodiments, the immersion cooling system can prevent from apparently affecting the original heat transfer rate of the heat transfer fluid and the original working performance of the boiler plate (as well as the attached elements of the boiler plate). Therefore, in some embodiments, the boiler plate and the attached elements of the boiler plate can reach superior working performances and service lives.

Although the present disclosure is disclosed in the foregoing embodiments as above, it is not intended to limit the instant disclosure. Any person who is familiar with the relevant art can make some changes and modifications without departing from the spirit and scope of the present disclosure. Therefore, the scope of the present disclosure shall be subject to the definition of the scope of patent application attached to the specification.

What is claimed is:

1. An immersion cooling system comprising:
a cooling tank having a receiving portion;
an immersion unit in the receiving portion and comprising a boiler plate;
a baffle assembly dividing the receiving portion into an inner upper portion, an inner lower portion, and a peripheral portion, wherein the boiler plate is in the inner lower portion, and a width of a distal end of the inner upper portion furthest away from the boiler plate has a width less than a width of the boiler plate; and
a heat transfer fluid received in the receiving portion and at least submerging the boiler plate;
wherein the immersion unit comprises:
a main body frame; and
an electronic device in the main body frame and comprising a heating element contacting the boiler plate;
wherein the baffle assembly comprises:
two side plates respectively at opposite sides of the boiler plate, wherein a section between the two side plates is the inner lower portion; and
two guiding plates respectively connected to a corresponding one of the two side plates, and a section between the two guiding plates is the inner upper portion;
wherein the two guiding plates are arranged above the boiler plate that conducts heat generated by the heating element of the electronic device.

2. The immersion cooling system according to claim 1, further comprising a condensation device above a surface of the heat transfer fluid.

3. The immersion cooling system according to claim 1, wherein a distance between the two guiding plates gradually decreases from bottom portions of the two guiding plates to top portions of the two guiding plates.

4. The immersion cooling system according to claim 1, wherein a connection portion between each of the two side plates and a corresponding one of the two guiding plates is higher than a top edge of the boiler plate.

5. The immersion cooling system according to claim 4, wherein lengths of the two side plates are respectively greater than a distance between a bottom edge of the boiler plate and the connection portion between each of the two side plates and the corresponding one of the two guiding plates.

6. The immersion cooling system according to claim 1, further comprising a plurality of the immersion units and a plurality of the baffle assemblies, wherein each of the plurality of immersion units corresponds to a corresponding one of the plurality of baffle assemblies, and the boiler plate of each of the plurality of immersion units is in a portion of the inner lower portion of the receiving portion corresponding to a corresponding one of the corresponding baffle assemblies.

7. The immersion cooling system according to claim 1, further comprising a plurality of condensation devices, wherein each of the plurality of condensation devices is above a surface of the heat transfer fluid at a corresponding one of the two sides of the baffle assembly.

8. The immersion cooling system according to claim 1, wherein for each of the plurality of immersion units, a distance between corresponding two of the plurality of guiding plates gradually decreases from bottom portions of the corresponding two of the plurality of guiding plates to top portions of the corresponding two of the plurality of guiding plates.

9. The immersion cooling system according to claim 1, wherein for each of the plurality of immersion units, a connection portion between each of the plurality of side plates and a corresponding one of the plurality of guiding plates is higher than a top edge of the boiler plate of the corresponding one of the plurality of immersion units.

10. The immersion cooling system according to claim 1, further comprising a plurality of the immersion units and a plurality of the baffle assemblies, wherein each of the plurality of immersion units corresponds to a corresponding one of the plurality of baffle assemblies.

11. An immersion cooling system, comprising:
a cooling tank having a receiving portion;
an immersion unit in the receiving portion and comprising a boiler plate;
a baffle assembly dividing the receiving portion into an inner upper portion, an inner lower portion, and a peripheral portion, wherein the boiler plate is in the inner lower portion, and a width of the inner upper portion is less than or equal to a width of the boiler plate; and
a heat transfer fluid received in the receiving portion and at least submerging the boiler plate;
wherein the immersion unit comprises:
a main body frame; and
an electronic device in the main body frame and comprising a heating element contacting the boiler plate;
wherein the baffle assembly comprises:
two side plates respectively at opposite sides of the boiler plate, wherein a section between the two side plates is the inner lower portion; and
two guiding plates, wherein one of two ends of each of the two guiding plates is connected to a corresponding one of the two side plates, and a section between the two guiding plates is the inner upper portion;
wherein:
a connection portion between each of the two side plates and a corresponding one of the two guiding plates is higher than a top edge of the boiler plate; and
lengths of the two side plates are respectively less than or equal to a distance between a bottom edge of the boiler plate and the connection portion between each of the two side plates and the corresponding one of the two guiding plates.

12. An immersion cooling system, comprising:

a cooling tank having a receiving portion;

an immersion unit in the receiving portion and comprising a boiler plate;

a baffle assembly dividing the receiving portion into an inner upper portion, an inner lower portion, and a peripheral portion, wherein the boiler plate is in the inner lower portion, and a width of the inner upper portion is less than or equal to a width of the boiler plate; and a heat transfer fluid received in the receiving portion and at least submerging the boiler plate;

wherein the immersion unit comprises:

a main body frame; and an electronic device in the main body frame and comprising a heating element contacting the boiler plate;

wherein the baffle assembly comprises:

two side plates respectively at opposite sides of the boiler plate, wherein a section between the two side plates is the inner lower portion;

two guiding plates, wherein one of two ends of each of the two guiding plates is connected to a corresponding one of the two side plates, and a section between the two guiding plates is the inner upper portion; and a plurality of sub-guiding plates, wherein the plurality of sub-guiding plates correspond to the two guiding plates to obtain a plurality of the inner upper portions divided from the receiving portion, and sections between the two guiding plates and the plurality of sub-guiding plates are the plurality of inner upper portions.

13. An immersion cooling system, comprising:

a cooling tank having a receiving portion;

a plurality of immersion units, wherein each of the plurality of immersion units is in the receiving portion and comprises a boiler plate; and a baffle assembly dividing the receiving portion into an inner upper portion, an inner lower portion, and a peripheral portion;

wherein two sides of the baffle assembly are opposite to each other, the baffle assembly divides the receiving portion into two sub receiving portions at the two sides of the baffle assembly, and each of the two sub receiving portions has the inner upper portion, the inner lower portion, and the peripheral portion, wherein the inner upper portion, the inner lower portion, and the peripheral portion at each of the two sides of the baffle assembly are in communication with each other, the boiler plates at each of the two sides of the baffle assembly are in the inner lower portions, and a width of the inner upper portion at each of the two sides of the baffle assembly is less than or equal to a width of the boiler plate at each of the two sides of the baffle assembly; and wherein the plurality of immersion units correspond to the two sides of the baffle assembly, and the boiler plate of each of the plurality of immersion units is in the inner lower portion which is at a corresponding one of the two sides of the baffle assembly.

14. The immersion cooling system according to claim 13, further comprising a heat transfer fluid, wherein the heat transfer fluid is received in the receiving portion and at least submerges the boiler plate of each of the plurality of immersion units; and each of the plurality of immersion units further comprises:

a main body frame; and an electronic device in the main body frame and comprising a heating element contacting the boiler plate of a corresponding one of the plurality of immersion units.

15. The immersion cooling system according to claim 14, further comprising a plurality of condensation devices, wherein each of the plurality of condensation devices is above a surface of the heat transfer fluid at a corresponding one of the two sides of the baffle assembly.

16. The immersion cooling system according to claim 13, wherein the baffle assembly comprises:

a plurality of side plates, wherein each two of the plurality of side plates are respectively at opposite sides of the boiler plate of a corresponding one of the plurality of immersion units to obtain the inner lower portion divided from the receiving portion, wherein a section between each two of the plurality of side plates is the inner lower portion; and a plurality of guiding plates, wherein one of two ends of each of the plurality of guiding plates is connected to a corresponding one of the plurality of side plates, and a section between each two of the plurality of guiding plates is the inner upper portion.

17. The immersion cooling system according to claim 16, wherein for each of the plurality of immersion units, a distance between corresponding two of the plurality of guiding plates gradually decreases from bottom portions of the corresponding two of the plurality of guiding plates to top portions of the corresponding two of the plurality of guiding plates.

18. The immersion cooling system according to claim 16, wherein for each of the plurality of immersion units, a connection portion between each of the plurality of side plates and a corresponding one of the plurality of guiding plates is higher than a top edge of the boiler plate of the corresponding one of the plurality of immersion units.

19. The immersion cooling system according to claim 16, wherein the baffle assembly comprises:

a plurality of sub-guiding plates, wherein the plurality of sub-guiding plates correspond to the plurality of guiding plates to obtain a plurality of the inner upper portions divided from the receiving portion, and sections between the plurality of guiding plates and the plurality of sub-guiding plates are the plurality of inner upper portions.

20. An immersion cooling system, comprising:

a cooling tank having a receiving portion;

a plurality of immersion units, wherein each of the plurality of immersion units is in the receiving portion and comprises a boiler plate; and a plurality of baffle assemblies, wherein each of plurality of baffle assemblies divides the receiving portion into an inner upper portion, an inner lower portion, and a peripheral portion; wherein each of the immersion units corresponds to a corresponding one of the baffle assemblies, and the boiler plate of each of the immersion units is in a portion of the inner lower portion of the receiving portion corresponding to a corresponding one of the corresponding baffle assemblies;

wherein the at least one of the baffle assemblies comprises:

a plurality of side plates, wherein each two of the side plates are respectively at opposite sides of the boiler plate of a corresponding one of the plurality of immersion units to obtain the inner lower portion divided from the receiving portion, wherein a section between each two of the plurality of side plates is the inner lower portion;

a plurality of guiding plates, wherein one of two ends of each of the plurality of guiding plates is connected to a corresponding one of the plurality of side plates, and a section between each two of the plurality of guiding plates is the inner upper portion; and a plurality of sub-guiding plates, wherein the plurality of sub-guiding plates correspond to the plurality of guiding plates to obtain a plurality of the inner upper portions divided from the receiving portion, and sections between the plurality of guiding plates and the plurality of sub-guiding plates are the plurality of inner upper portions.

* * * * *